(12) United States Patent
Kopp et al.

(10) Patent No.: US 7,795,575 B2
(45) Date of Patent: Sep. 14, 2010

(54) LIGHT-EMITTING DEVICE WITH CHROMATIC CONTROL

(75) Inventors: Christophe Kopp, Fontanil-Cornillon (FR); Xavier Hugon, Voiron (FR); Bruno Mourey, Coublevie (FR); Alexei Tchelnokov, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 79 days.

(21) Appl. No.: 12/087,592

(22) PCT Filed: Jan. 29, 2007

(86) PCT No.: PCT/FR2007/000166

§ 371 (c)(1),
(2), (4) Date: Jul. 10, 2008

(87) PCT Pub. No.: WO2007/088267

PCT Pub. Date: Aug. 9, 2007

(65) Prior Publication Data

US 2009/0040755 A1  Feb. 12, 2009

(30) Foreign Application Priority Data

Jan. 31, 2006 (FR) .................................. 06 00867

(51) Int. Cl.
*F21V 99/00* (2006.01)
(52) U.S. Cl. ................. 250/226; 250/214.1; 250/214 R; 356/319

(58) Field of Classification Search ............. 250/208.1, 250/214.1, 214 R, 226; 356/319
See application file for complete search history.

(56) References Cited

U.S. PATENT DOCUMENTS

| 5,301,090 | A | 4/1994 | Hed |
| 5,965,875 | A | 10/1999 | Merrill |
| 6,741,351 | B2 | 5/2004 | Marshall et al. |
| 7,489,396 | B1 * | 2/2009 | Vrhel et al. ................. 250/226 |
| 2002/0047624 | A1 | 4/2002 | Stam et al. |

FOREIGN PATENT DOCUMENTS

| WO | WO 02/052902 A2 | 7/2002 |
| WO | WO 02/099333 A1 | 12/2002 |
| WO | WO 03/010830 A2 | 2/2003 |

* cited by examiner

*Primary Examiner*—Seung C Sohn
(74) *Attorney, Agent, or Firm*—Oliff & Berridge, PLC

(57) ABSTRACT

The light-emitting device includes a base substrate and preferably three light-emitting diodes respectively associated with three primary colors and emitting a part of their signal in the direction of the base substrate. The device includes three chromatic photodetectors formed in the base substrate constituting a semiconducting substrate, and each arranged under an associated light-emitting diode. Each chromatic photodetector includes superposed first, second and third layers. The first layer and third layer have a first type of conductivity and the second layer has a second type of conductivity. The device includes a control component connected to the chromatic photodetectors and to the light-emitting diodes to control the global color of the light emitted by the device.

11 Claims, 3 Drawing Sheets

LIGHT-EMITTING DEVICE WITH CHROMATIC CONTROL

BACKGROUND OF THE INVENTION

The invention relates to a light-emitting device comprising:
a base substrate,
at least two light-emitting diodes respectively associated with two different colors and arranged side by side on said base substrate,
chromatic detection means,
control means connected to said chromatic detection means and to the light-emitting diodes to control the global color of the light emitted by the device.

STATE OF THE ART

A white light source is conventionally obtained from several groups of given color sources. A conventional light-emitting device generates a white light from a set of three groups of light-emitting diodes (LEDs) of three different colors, for example red, green and blue.

U.S. Pat. No. 5,301,090 in particular describes a device emitting white light obtained by a combination of monochromatic emitters of the light-emitting diode type. The emitters are of different colors, for example one blue, one red and one green, are assembled one after the other and are connected to a controller enabling the light emitted by the device to be adjusted. Such a device does not however enable chromatic drifts and power drifts of the different emitters to be controlled.

The document WO-A-02/052902 describes a lighting unit comprising a plurality of light-emitting diodes of three different colors designed to generate a white light. Adjustment of the white color emitted by the group of diodes is performed in dynamic manner by using knobs. To know how to adjust the diodes, the power emitted by each group of diodes of the same color is measured sequentially by a same photodiode. Each group of diodes is then lit successively to make the measurements, the other two groups switching off during a short impulse. However, this type of device does not enable the chromatic drifts of each group of light-emitting diodes to be controlled.

U.S. Pat. No. 6,741,351 describes a light-emitting device of the same type as the one described above comprising a photodiode with colored filters which permute successively, or several photodiodes each comprising a fixed colored filter. However, such a device does not enable the chromatic drifts of the colored filters and the chromatic drifts of the light-emitting diodes to be controlled.

Another example of a conventional light-emitting device 1 is represented schematically in FIG. 1. The light-emitting device 1 comprises a base substrate 2 on which three light-emitting diodes 3a, 3b, 3c are formed emitting beams Fa, Fb, Fc respectively associated for example with the three primary colors, red, green and blue.

Light-emitting diodes 3a, 3b, 3c are arranged side by side on base substrate 2 under a partially reflecting lens 4 designed to reflect light beams Fa, Fb, Fc in the direction of base substrate 2. Device 1 comprises three photodiodes 5a, 5b, 5c for chromatic detection of the light beams reflected by lens 4, respectively associated with the three primary colors, red, green and blue. Photodiodes 5a, 5b, 5c each preferably comprise a colored filter (not shown) for measuring only the intensity of the primary color associated therewith.

Photodiodes 5a, 5b, 5c are adjacent to light-emitting diodes 3a, 3b, 3c and lens 4 delineates a volume above light-emitting diodes 3a, 3b, 3c and photodiodes 5a, 5b, 5c on base substrate 2. Device 1 also comprises a control component 6 placed on base substrate 2 and connected to light-emitting diodes 3a, 3b, 3c and to photodiodes 5a, 5b, 5c. Control component 6 in particular enables the global color of the light emitted by light-emitting device 1 to be controlled.

None of the devices described above enables the chromatic drifts of the light-emitting diodes to be controlled according to the power emitted or, in the case of use of colored filters, to control the chromatic drifts of the colored filters due to their aging. Furthermore, none of the devices guarantees that a given color will be obtained.

OBJECT OF THE INVENTION

The object of the invention is to remedy all the above-mentioned shortcomings and to provide a light-emitting device performing chromatic control of the global color of the emitted light, while at the same time improving the long-term reliability of the device.

The object of the invention is achieved by the appended claims and more particularly by the fact that:
the chromatic detection means comprise at least one chromatic photodetector measuring the chromatic components of the signal emitted by the light-emitting diodes at different buried levels in a semiconducting substrate and respectively associated with wavelengths corresponding to the chromatic components,
said chromatic photodetector comprises at least first and second layers superposed in said semiconducting substrate, the first layer having a first type of conductivity and the second layer having a second type of conductivity.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PARTICULAR EMBODIMENTS

Figure 3:
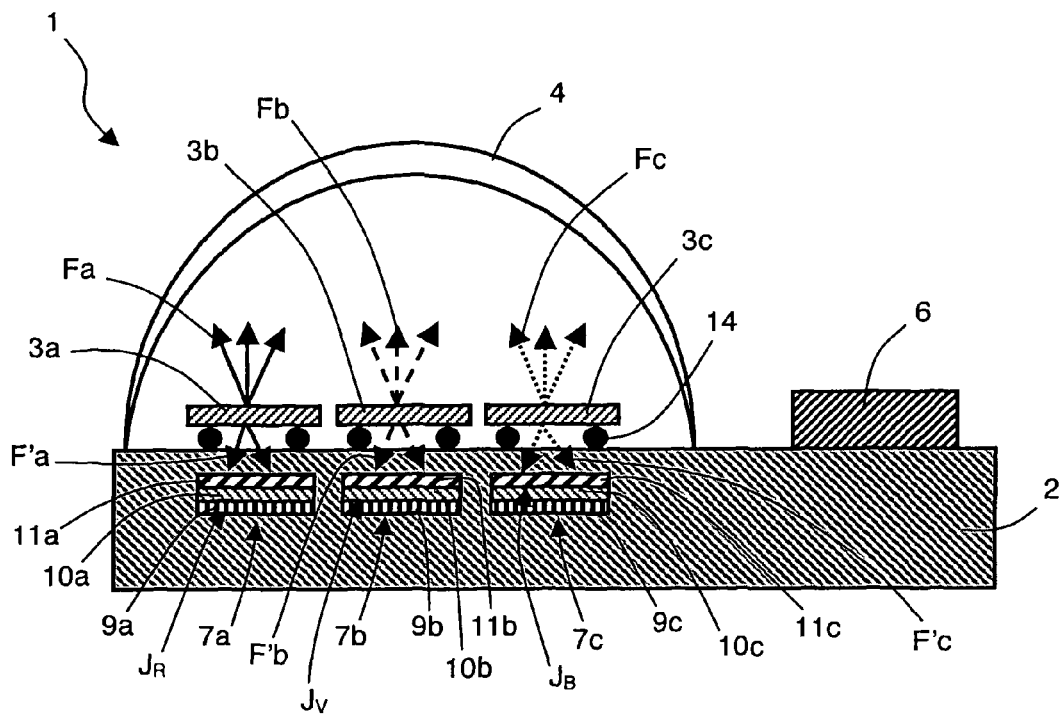
FIG. 3 schematically represents a cross-sectional view of a first embodiment of a light-emitting device according to the invention.
Figure 4:
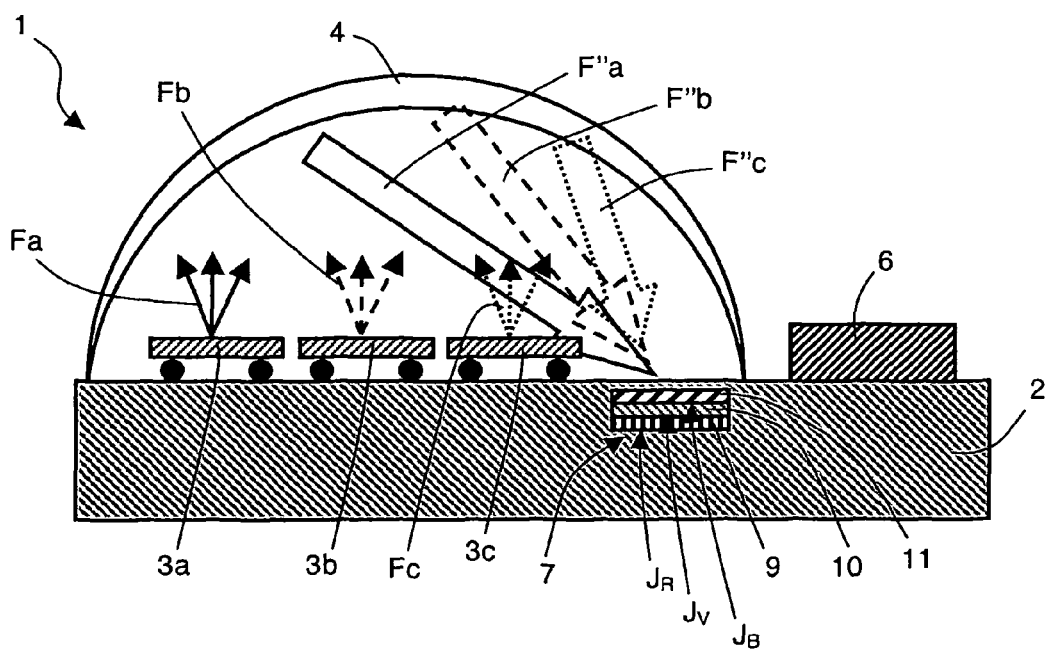
FIG. 4 schematically represents a cross-sectional view of an alternative embodiment of a light-emitting device according to the invention.
Figure 5:
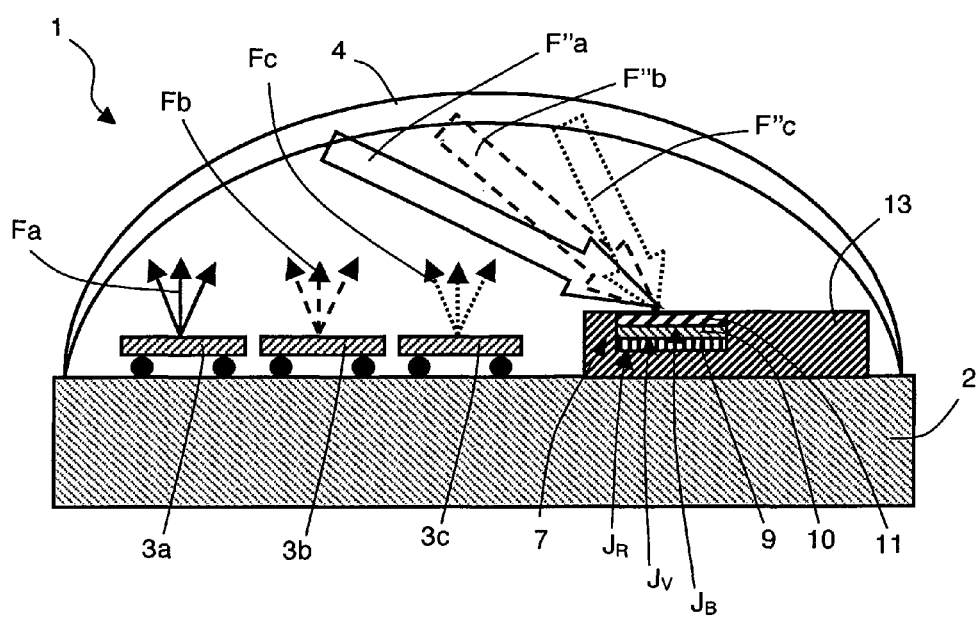
FIG. 5 schematically represents a cross-sectional view of another alternative embodiment of a light-emitting device according to the invention.

In FIGS. 3 to 5, the light-emitting device 1 is particularly designed to optimize chromatic control of the global color of the emitted light, in particular by controlling the intensity of three light-emitting diodes 3, respectively associated with three primary colors, for example red, green and blue.

The chromatic detection means used in the different particular embodiments of light-emitting device 1 as represented in FIGS. 3 to 5 comprise, in particular, at least one chromatic photodetector 7 as described in U.S. Pat. No. 5,965,875 and as represented schematically in FIG. 2.

Figure 1:
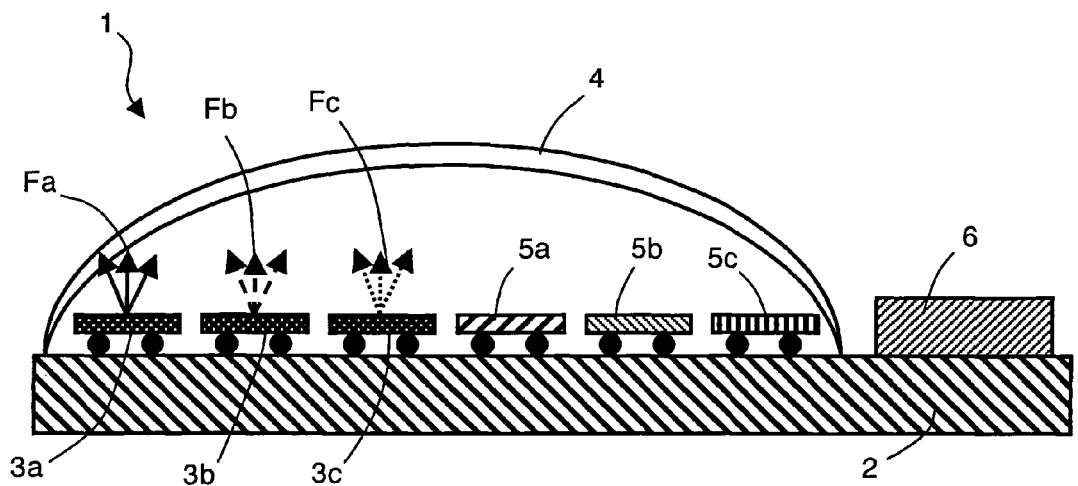
FIG. 1 schematically represents a cross-sectional view of a light-emitting device according to the prior art.
Figure 2:
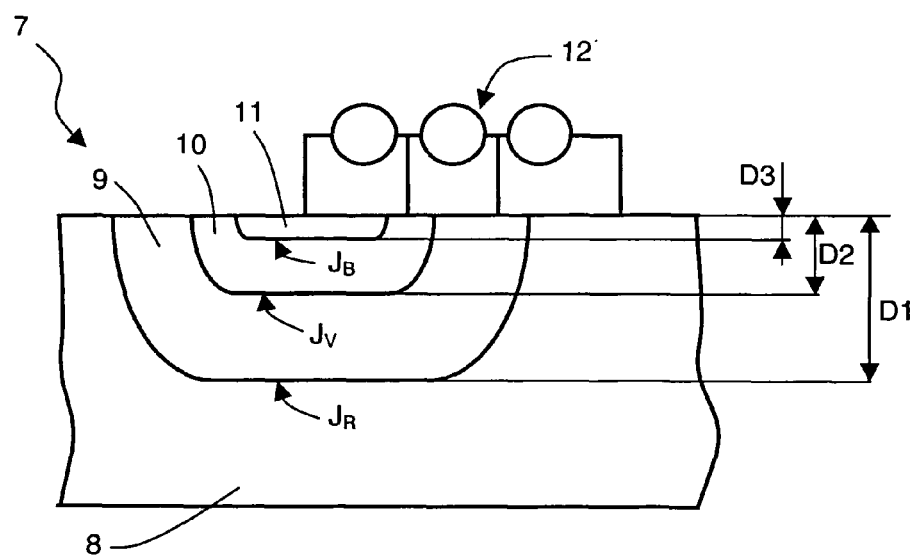
FIG. 2 very schematically represents a chromatic photodetector according to the prior art used in a light-emitting device according to the invention.

In FIG. 2, chromatic photodetector 7 is designed to measure the red, green and blue chromatic components of the light at different buried levels in a semiconducting substrate 8. Each buried level has a defined depth according to the wavelengths corresponding to the different colors to be detected.

Chromatic photodetector 7 comprises three superposed layers 9, 10, 11 in semiconducting substrate 8. First layer 9 has a first type of conductivity, for example n-type, second layer 10 has a second type of conductivity, for example p-type, and third layer 11 has the same type of conductivity as first layer 9, i.e. n-type. Semiconducting substrate 8 has the same type of conductivity as second layer 10, i.e. p-type, so that there is an alternation of conductivity between the different layers 9, 10, 11 and semiconducting substrate 8.

The first junction $J_R$, of pn-type, between semiconducting substrate 8 and first layer 9 delineates the approximate absorption depth of red light and forms a first detection photodiode associated with the wavelengths of the red component of the light.

The second junction $J_V$, of pn-type, between first layer 9 and second layer 10 delineates the approximate absorption depth of green light and forms a second detection photodiode associated with the wavelengths of the green component of the light.

The third junction $J_B$, of pn-type, between second layer 10 and third layer 11 delineates the approximate absorption depth of blue light and forms a third detection photodiode associated with the wavelengths of the blue component of the light.

For example purposes, first junction $J_R$ between semiconducting substrate 8 and first layer 9 is formed at a depth D1 of about 1.5 μm to 3 μm, preferably about 2 μm. Second junction $J_V$ between first layer 9 and second layer 10 is formed at a depth D2 of about 0.5 μm to 1.5 μm, preferably about 0.6 μm. Third junction $J_B$ between second layer 10 and third layer 11 is formed at a depth D3 of about 0.2 μm to 0.5 μm, preferably about 0.2 μm.

Layers 9, 10, 11 and semiconducting substrate 8 are further connected to a measuring component 12 designed to measure the photoelectric currents flowing through the three detection photodiodes formed by junctions $J_R$, $J_V$, $J_B$, associated with the three primary colors.

Such a chromatic photodetector with stacking of the three layers 9, 10, 11 thereby enables all the components of the light to be measured on a single location.

In the particular embodiment represented in FIG. 3, light-emitting device 1 comprises three light-emitting diodes 3a, 3b, 3c, respectively associated with three primary colors, for example blue, green and red. Light-emitting diodes 3a, 3b, 3c emit a part of their signal in the direction of lens 4, i.e. light beams Fa, Fb, Fc, and another part of their signal in the direction of base substrate 2, i.e. light beams F'a, F'b and F'c. In the particular embodiment represented in FIG. 3, lens 4 is optional.

Light-emitting device 1 comprises three chromatic photodetectors 7a, 7b, 7c each represented schematically by its three superposed layers 9, 10, 11 and each operating like chromatic photodetector 7 described in FIG. 2. Chromatic photodetectors 7a, 7b, 7c are formed in base substrate 2 which then forms the semiconducting substrate cooperating with first layer 9a, 9b, 9c of photodetectors 7a, 7b, 7c.

Each chromatic photodetector 7a, 7b, 7c is arranged under the corresponding light-emitting diode 3a, 3b, 3c and comprises three superposed layers 9a, 10a, 11a, 9b, 10b, 11b and 9c, 10c, 11c which form, with the semiconducting substrate, the detection photodiodes for the three corresponding primary colors.

In FIG. 3, first junction $J_R$ between base substrate 2 and first layer 9a of photodetector 7a forms the first detection photodiode enabling the intensity of the red light emitted by light-emitting diode 3a to be measured.

The second junction $J_V$ between first layer 9b and second layer 10b of photodetector 7b forms the second detection photodiode enabling the intensity of the green light emitted by light-emitting diode 3b to be measured.

The third junction $J_B$ between second layer 10c and third layer 11c of photodetector 7c forms the third detection photodiode enabling the intensity of the blue light emitted by light-emitting diode 3c to be measured.

Chromatic photodetectors 7a, 7b, 7c and light-emitting diodes 3a, 3b, 3c are further connected to one and the same integrated control component 6 formed on base substrate 2, preferably outside lens 4, in the case where device 1 comprises a lens 4. Control component 6 in particular enables the different components of the light to be controlled, to control the global color emitted by device 1.

In an alternative embodiment, not shown, light-emitting device 1 can comprise groups of light-emitting diodes 3a, 3b, 3c each emitting a primary color. Chromatic photodetectors 7a, 7b, 7c are then associated with the corresponding group of light-emitting diodes 3a, 3b, 3c and are arranged under the corresponding groups. Each photodetector 7a, 7b, 7c then presents a suitable size in order to measure a sufficient part of the signal emitted by all the light-emitting diodes 3a, 3b, 3c of the corresponding group.

For example, a known flip-chip hybridization method can be used to fabricate light-emitting device 1 as described above. As represented in FIG. 3, the method first consists in forming balls 14 of fusible alloy, for example of indium or tin and silver alloy, on base substrate 2 in a precise and controlled manner with respect to the position of photodetectors 7a, 7b, 7c formed in substrate 2. Different deposition, etching and patterning steps then enable wafers of fusible alloy to be formed. Remelting the wafers then results in the formation of balls 14.

The method then consists in transferring the component forming light-emitting diodes 3a, 3b, 3c onto balls 14 with a rough pre-alignment on balls 14. The component is preferably provided with suitable adhesion surfaces in order to perform a subsequent brazing step. The component for example comprises a tri-layer of titanium, nickel and gold.

Finally a brazing step is performed to induce self-alignment of light-emitting diodes 3a, 3b, 3c on balls 14. Precise positioning of balls 14 with respect to photodetectors 7a, 7b, 7c thus ensures precise positioning of light-emitting diodes 3a, 3b, 3c with respect to chromatic photodetectors 7a, 7b, 7c.

Such a light-emitting device 1 with a photodetector 7a, 7b, 7c associated with each primary color to be detected in particular enables precise individual control of each light-emitting diode 3a, 3b, 3c to be achieved. Furthermore, such a fabrication method of light-emitting device 1 in particular optimizes the alignment of light-emitting diodes 3 above photodetectors 7 and improves efficiency of the fabrication method.

In an alternative embodiment, not shown, light-emitting device 1, as represented in FIG. 3, can in particular comprise only two light-emitting diodes 3 only, or two groups of light-emitting diodes, respectively associated with two different colors. Device 1 then comprises two chromatic photodetectors 7 each being associated with a diode or a group of diodes and each comprising three superposed layers, as described previously, or only two superposed layers, having different types of conductivity. Each chromatic photodetector 7 with two layers then only defines two junctions forming detection photodiodes associated with the wavelengths corresponding to the two colors to be detected.

In the alternative embodiment represented in FIG. 4, light-emitting device 1 differs from previously described device 1 by lens 4, which is preferably partly reflecting. Light-emitting diodes 3a, 3b, 3c emit their signal, in particular beams Fa, Fb, Fc, only in the direction of lens 4, and light-emitting device 1 comprises a single chromatic photodetector 7 arranged laterally with respect to light-emitting diodes 3a, 3b, 3c.

In the particular embodiment represented in FIG. 4, chromatic photodetector 7 is formed under lens 4 in base substrate 2 constituting the semiconducting substrate associated with the three layers 9, 10, 11 of chromatic photodetector 7. Chromatic photodetector 7 is designed to detect reflected beams F'''a, F'''b and F'''c, associated with the three primary colors emitted by light-emitting diodes 3a, 3b, 3c.

Operation of chromatic photodetector 7 is identical to the operation described in FIG. 2. First junction $J_R$ between base substrate 2 and first layer 9 is associated with detection of reflected light beams F'''a corresponding to the red component of the light. Second junction $J_V$ between first layer 9 and second layer 10 is associated with detection of reflected light beams F'''b corresponding to the green component of the light. Third junction $J_B$ between second layer 10 and third layer 11 is associated with detection of reflected light beams F'''c corresponding to the blue component of the light.

As before, a control component 6 is connected both to light-emitting diodes 3a, 3b, 3c and to chromatic photodetector 7 to control the global color emitted by light-emitting device 1.

Such a light-emitting device 1 with a single chromatic photodetector 7 in particular enables global control of the color emitted by the device. It also provides the possibility of detection of the ambient light. Furthermore, the light-emitting diodes used in device 1 are of conventional fabrication and design. It results in simplicity of fabrication of such a light-emitting device 1.

In the alternative embodiment represented in FIG. 5, light-emitting device 1 differs from the previously described device 1 by a control component 13 integrated on base substrate 2 and under the partially reflecting lens 4.

Chromatic photodetector 7 is formed on base substrate 2 and preferably in integrated control component 13 placed under lens 4 laterally with respect to light-emitting diodes 3a, 3b, 3c. Control component 13 then forms the semiconducting substrate operating in conjunction with the three layers 9, 10, 11 of chromatic photodetector 7 for detection of the different components of the light.

As before, light-emitting diodes 3a, 3b, 3c emit beams Fa, Fb, Fc in the direction of partially reflecting lens 4 and chromatic photodetector 7 detects beams F'''a, F'''b, F'''c reflected by lens 4.

First junction $J_R$ between control component 13 and first layer 9 is associated with detection of reflected light beams F'''a corresponding to the red component of the light. Second junction $J_V$ between first layer 9 and second layer 10 is associated with detection of reflected light beams F'''b corresponding to the green component of the light. Third junction $J_B$ between second layer 10 and third layer 11 is associated with detection of reflected light beams F'''c corresponding to the blue component of the light.

Integrated control component 13 is further connected to light-emitting diodes 3a, 3b, 3c to measure and control the global color emitted by device 1.

Such a light-emitting device 1 with chromatic photodetector 7 integrated in control component 13 in particular enables the chromatic control and detection functions of device 1 to be fully integrated. Base substrate 2 can moreover merely serve the purpose of electric connection and thermal control of light-emitting device 1.

In other alternative embodiments that are not represented, light-emitting device 1, as represented in FIGS. 4 and 5, can comprise a group of light-emitting diodes 3a, 3b, 3c pour each color emitted. Operation of light-emitting device 1 remains the same, the dimensions of chromatic photodetector 7 being adapted accordingly to detect at least a sufficient part of the light reflected by lens 4.

Light-emitting device 1 as represented in FIGS. 4 and 5 can moreover be fabricated by means of the same flip-chip hybridization method described above, with self-alignment induced by brazing and formation of balls 14 by remelting of the fusible alloy wafers.

In other alternative embodiments that are not represented, light-emitting device 1, as represented in FIGS. 4 and 5, can comprise only two light-emitting diodes 3, or two groups of light-emitting diodes, respectively associated with two different colors. The associated chromatic photodetector 7, arranged laterally with respect to the diodes in substrate 2 (FIG. 4), or on substrate 2, integrated in control component 13 (FIG. 5), can then comprise three superposed layers, as described previously in FIG. 2, or only two superposed layers forming two junctions acting as detection photodiodes associated with the corresponding wavelengths of the two colors to be detected.

Whatever the embodiment of light-emitting device 1 described above, optimal chromatic control of the global color of the light emitted is able to be achieved. Device 1 also enables the disparities between the different groups of light-emitting diodes 3 to be compensated and chromatic drifts of light-emitting diodes 3 to be controlled. This results in improvement of the long-term reliability of the chromatic control system.

Such a light-emitting device 1 is moreover very compact and very simple to manufacture, in particular by means of conventional flip-chip hybridization methods.

The invention is not limited to the different particular embodiments described above. In the case of use of groups of light-emitting diodes to emit the colors, the latter can be arranged in regular manner on base substrate 2, for example in the form of a two-dimensional matrix, or be arranged in random manner, provided that the chromatic photodetector associated with this color can detect the whole set of beams emitted by light-emitting diodes 3 (FIG. 3) or reflected by lens 4 (FIGS. 4 and 5).

In FIG. 2, semiconducting substrate 8 of chromatic photodetector 7 can have the second type of conductivity, i.e. n-type, and superposed layers 9, 10, 11 can also have the other type of conductivity, i.e. respectively p-type, n-type, and p-type.

The dimensions D1, D2 and D3 of the depths of junctions $J_R$, $J_V$, $J_B$ are non-restrictive and depend essentially on the general size of chromatic photodetector 7.

Such a light-emitting device 1 according to the different embodiments described above can apply in particular in the field of lighting for the general public, in the art field, and so on.

The invention claimed is:

1. A light-emitting device comprising:
   a base substrate,
   at least two light-emitting diodes respectively associated with two different colors and arranged on said base substrate,
   chromatic detection means comprising at least one chromatic photodetector arranged for measuring the chromatic components of the signal emitted by the light-emitting diodes, said chromatic photodetector comprising at least first and second superposed layers in a semiconducting substrate associated respectively with said two colors, the first layer having a first type of conductivity and the second layer having a second type of conductivity,
   control means, connected to said chromatic detection means and to the light-emitting diodes to control the global color of the light emitted by the device.

2. The device according to claim 1 wherein the device comprises three light-emitting diodes respectively associated with three primary colors.

3. The device according to claim 1 wherein the chromatic photodetector comprises first, second and third superposed layers in said semiconducting substrate, the first and third layers having a first type of conductivity and the second layer having a second type of conductivity.

4. The device according to claim 1 wherein, the light-emitting diodes emitting at least a part of their signal in the direction of the base substrate, the chromatic detection means comprise at least two chromatic photodetectors formed in the base substrate constituting said semiconducting substrate and each arranged under an associated light-emitting diode.

5. The device according to claim 4 wherein, each color being emitted by a group of light-emitting diodes, each chromatic photodetector is arranged under an associated group.

6. The device according to claim 1 comprising a partially reflecting lens arranged above the light-emitting diodes.

7. The device according to claim 6 wherein, the chromatic photodetector detecting at least a part of the light reflected by the lens, the chromatic photodetector is formed on the base substrate.

8. The device according to claim 7 wherein the chromatic photodetector is formed in the base substrate constituting said semiconducting substrate.

9. The device according to claim 7 wherein the chromatic photodetector is formed on the base substrate.

10. The device according to claim 9 wherein, the control means being formed by an integrated control component placed under the lens lateraly with respect to the light-emitting diodes, the chromatic photodetector is formed in said integrated control component.

11. The device according to claim 7 wherein each color is emitted by a group of light-emitting diodes.

* * * * *